US011955351B2

(12) United States Patent
Lee (10) Patent No.: US 11,955,351 B2
(45) Date of Patent: Apr. 9, 2024

(54) COOLING WATER CIRCULATION SYSTEM-INTEGRATED BY-PRODUCT COLLECTION APPARATUS

(71) Applicant: J-SOLUTION CO., LTD., Yongin-si (KR)

(72) Inventor: Seungyong Lee, Hwaseong-si (KR)

(73) Assignee: J-SOLUTION CO., LTD., Yongin-si (KR)

(*) Notice: Subject to any disclaimer, the term of this patent is extended or adjusted under 35 U.S.C. 154(b) by 671 days.

(21) Appl. No.: 17/257,401

(22) PCT Filed: Dec. 2, 2020

(86) PCT No.: PCT/KR2020/017495
§ 371 (c)(1),
(2) Date: Dec. 31, 2020

(87) PCT Pub. No.: WO2021/112569
PCT Pub. Date: Jun. 10, 2021

(65) Prior Publication Data
US 2021/0366734 A1    Nov. 25, 2021

(30) Foreign Application Priority Data
Dec. 6, 2019    (KR) .................. 10-2019-0161658

(51) Int. Cl.
*B01D 53/22*  (2006.01)
*H01L 21/67*  (2006.01)

(52) U.S. Cl.
CPC .............................. *H01L 21/67017* (2013.01)

(58) Field of Classification Search
CPC ................... H01L 21/67017; H01L 21/67011
See application file for complete search history.

(56) References Cited

U.S. PATENT DOCUMENTS 2,539,992 A * 1/1951 Cover ................. B01D 47/028
210/150
4,651,714 A * 3/1987 Granberg ............. F23D 14/126
122/182.3
(Continued)

FOREIGN PATENT DOCUMENTS

KR    10-0558562 B1    3/2006
KR    10-0564272 B1    3/2006
(Continued)

OTHER PUBLICATIONS

International Search Report for PCT/KR2020/017495 dated Mar. 9, 2021 from Korean Intellectual Property Office.
(Continued)

*Primary Examiner* — Anthony R Shumate
(74) *Attorney, Agent, or Firm* — Paratus Law Group, PLLC (57) ABSTRACT

Disclosed is a by-product collection apparatus which collects a by-product generated during a manufacturing process of manufacturing a semiconductor or a semiconductor-like product. The apparatus includes: a by-product collection module connected to a pipeline in series and configured to collect a by-product from a by-product gas, wherein the by-product gas flows in the pipeline having an inlet pipe and an outlet pipe provided at upper and lower portions of a first casing; and a cooling water supply module including a cooling water tank and a cooling water pump in a second casing and configured to supply and recover cooling water to and from the by-product collection module through a cooling pipe.

12 Claims, 5 Drawing Sheets

(56) References Cited

U.S. PATENT DOCUMENTS

| | | | | |
|---|---|---|---|---|
| 2008/0128108 | A1* | 6/2008 | Clark | F24T 10/10 165/45 |
| 2010/0221642 | A1* | 9/2010 | Frahm | B64D 41/00 429/512 |
| 2011/0041707 | A1* | 2/2011 | Delgadillo | F24C 15/10 99/422 |
| 2013/0099491 | A1* | 4/2013 | Iovenitti | F24T 10/20 165/45 |
| 2018/0334750 | A1* | 11/2018 | Obot | C09K 8/04 |
| 2020/0291297 | A1* | 9/2020 | Obot | C23F 11/10 |
| 2020/0299577 | A1* | 9/2020 | Abdulazeez | C23F 11/04 |
| 2020/0318243 | A1* | 10/2020 | Obot | C23F 11/149 |
| 2021/0371940 | A1* | 12/2021 | Burns | C12Q 1/689 |
| 2023/0183640 | A1* | 6/2023 | Dave | C09K 8/54 435/244 |
| 2023/0228664 | A1* | 7/2023 | Tong | G01N 15/04 73/23.2 |

FOREIGN PATENT DOCUMENTS

| | | |
|---|---|---|
| KR | 10-0717837 B1 | 5/2007 |
| KR | 10-0937160 B1 | 1/2010 |
| KR | 10-1218002 B1 | 1/2013 |
| KR | 10-2013-0013195 A | 2/2013 |
| KR | 10-2015-0033535 A | 4/2015 |
| KR | 10-2127952 B1 | 6/2020 |

OTHER PUBLICATIONS

Korean Office Action for related KR Application No. 10-2019-0161658 dated Feb. 10, 2020 from Korean Intellectual Property Office.

Korean Notice of Allowance for related KR Application No. 10-2019-0161658 dated Jun. 5, 2020 from Korean Intellectual Property Office.

* cited by examiner

COOLING WATER CIRCULATION SYSTEM-INTEGRATED BY-PRODUCT COLLECTION APPARATUS

CROSS-REFERENCE TO PRIOR APPLICATIONS

This application is a National Stage Patent Application of PCT International Patent Application No. PCT/KR2020/017495 (filed on Dec. 2, 2020) under 35 U.S.C. § 371, which claims priority to Korean Patent Application No. 10-2019-0161658 (filed on Dec. 6, 2019), which are all hereby incorporated by reference in their entirety.

BACKGROUND

The present invention relates to equipment for manufacturing a semiconductor or a semiconductor-like product, and more particularly, to a cooling water circulation system-integrated by-product collection apparatus that may effectively collect various by-products generated during a manufacturing process in a low temperature atmosphere using cooling water and may be installed freely without restrictions even in a place where an infrastructure for supplying cooling water is not established.

In general, a semiconductor manufacturing process roughly includes a pre-process (fabrication process) and a post-process (assembly process), wherein the pre-process refers to a process in which thin films are deposited on wafers in various process chambers, the deposited thin films are selectively and repeatedly etched to process specific patterns, and thus so-called semiconductor chips are manufactured, and the post-process refers to a process in which the chips manufactured in the pre-process are individually separated and are then coupled to lead frames, and thus finished products are assembled.

In this case, the process of depositing the thin film on the wafer or etching the thin film deposited on the wafer is performed in the process chamber using harmful gases such as silane, arsine, and boron chloride and a process gas such as hydrogen at a high temperature, and during the process, a large amount of various ignitable gases, corrosive foreign substances, harmful gases containing toxic components, and the like are generated in the process chamber.

Thus, in semiconductor manufacturing equipment, a scrubber that purifies exhaust gas discharged from the process chamber and then discharges the purified gas to the atmosphere is installed at a rear end of a vacuum pump that makes the process chamber into a vacuum state.

However, the exhaust gas discharged from the process chamber is solidified into powder when the exhaust gas comes into contact with the atmosphere or the ambient temperature is low, and the powder is fixed to an exhaust line to increase the exhaust pressure, and at the same time, when being introduced into the vacuum pump, causes a failure of the vacuum pump and a reverse flow of the exhaust gas to contaminate the wafer in the process chamber.

Figure 1:
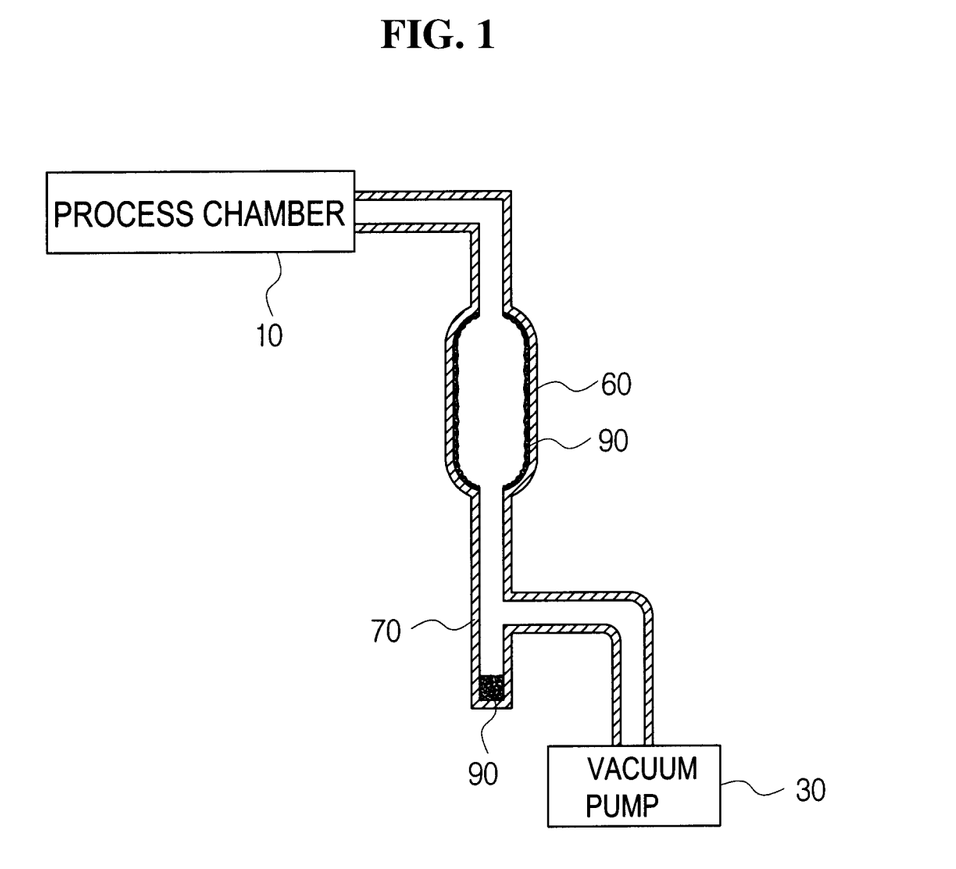
FIG. 1 is a reference view for describing a powder trapping device according to the related art.

Accordingly, in order to solve the above problems, as illustrated in FIG. 1, a powder trapping device that adheres the exhaust gas discharged from a process chamber 10 in a powder state is installed between the process chamber 10 and a vacuum pump 30. That is, a trapping pipe 70 for collecting by-products generated in the process chamber 10 in a powder form is installed in a branched form from a pumping line 60 connecting the process chamber 10 and the vacuum pump 30. Accordingly, unreacted gas generated during the deposition or etching of a thin film inside the process chamber 10 is solidified into powder while being introduced into the pumping line 60 having a relatively low temperature atmosphere as compared to the process chamber 10. Thereafter, the powder is accumulated in the trapping pipe 70 installed to be branched off from the pumping line 60.

However, in the case of a method of collecting by-products generated during a manufacturing process by the trapping pipe 70 in the past, a long time is taken until a by-product gas is converted into a powder and the converted power is collected in the trapping pipe 70, and the trapping pipe 70 is frequently replaced because a space of the trapping pipe 70 is very narrow.

In order to solve the problems of the trapping pipe 70 in the past, in a "semiconductor by-product trapping device" disclosed in Korean Patent No. 0564272 (Mar. 20, 2006), a cooling line is installed at an inner wall surface of a housing to have a low-temperature atmosphere, thereby more rapidly solidifying and collecting the by-product gas.

However, in the case of the by-product trapping device equipped with the cooling line as described above, the by-product trapping device may be used only in a place where an infrastructure for supplying a low-temperature refrigerant or cooling water to the cooling line has already been established.

SUMMARY

The present invention is directed to providing a cooling water circulation system integrated by-product collection apparatus that may effectively collect various by-products generated during a manufacturing process at a low temperature atmosphere using cooling water and may be installed freely without restrictions even in a place where an infrastructure for supplying cooling water is not established.

One aspect of the present invention provides a by-product collection apparatus, which collects a by-product generated during a manufacturing process of manufacturing a semiconductor or a semiconductor-like product, according to the technical spirit of the present invention, the apparatus including a by-product collection module connected to a pipeline in series and configured to collect a by-product from the by-product gas, wherein the by-product gas flows in the pipeline having an inlet pipe and an outlet pipe provided at upper and lower portions of a first casing, and a cooling water supply module including a cooling water tank and a cooling water pump in a second casing and configured to supply and recover cooling water to and from the by-product collection module through a cooling pipe.

The first casing of the by-product collection module and the second casing of the cooling water supply module may be integrally coupled to each other.

The cooling water supply module may further include a heat exchange member installed on a cooling water supply side of the by-product collection module, and the heat exchange member may include a thermoelectric plate in which a plurality of thermoelectric elements are arranged such that a heat absorption surface and a heat emission surface face one side and the other side in a plan view, respectively, and a cooling tank attached to face the heat absorption surface of the thermoelectric plate so that the cooling water passes through the cooling tank before being supplied to the by-product collection module.

The heat exchange member may be installed in a space saving form in which the thermoelectric plate is formed in a quadrangular shape, and the cooling tank is formed in a flat rectangular parallelepiped shape to correspond to and face the thermoelectric plate and is vertically stood up.

The heat exchange member may further include a heat exchange tank attached to face the heat emission surface of the thermoelectric plate so that heat dissipation of the thermoelectric element is smoothly performed while process cooling water supplied from the outside passes through the heat exchange tank.

The heat exchange member may be installed in a space saving form in which the thermoelectric plate is formed in a quadrangular shape, and the heat exchange tank is formed in a flat rectangular parallelepiped shape to correspond to and face the thermoelectric plate and is vertically stood up.

An inlet pipe flange of the by-product collection module may have an internal flow path formed in a circumferential direction thereof, and a portion of the process cooling water supplied to the heat exchange tank may be branched off and pass through the internal flow path formed in the inlet pipe flange of the collection module.

An upper surface of the first casing of the by-product collection module may be formed as an upper cover to be openable or closable, a circulation hole may be formed inside the upper cover, and a portion of the process cooling water supplied to the inlet pipe flange may be branched off and introduced into the inlet pipe flange to be circulated and discharged through the circulation hole to induce deposition of the by-product gas coming into contact with a lower surface of the upper cover.

The circulation hole may be formed with a wide width from a center of the inlet pipe of the upper cover to a circumference of the upper cover.

The by-product collection apparatus may further include a water tank which is installed below the second casing of the cooling water supply module and is a place in which the cooling water leaking from an inside of the second casing is collected, and a leak detection sensor installed on a bottom surface of the water tank and configured to detect the leaked cooling water, wherein leakage of the cooling water is detected with only a small amount of water leakage.

The by-product collection module may include: a first casing including an inlet pipe and an outlet pipe connected to a pipeline, through which the by-product gas flows, in upper and lower portions of the first casing; a filtering member installed inside the first casing in a state in which an upper end of the filtering member communicates with a lower end of the inlet pipe, and configured to filter some by-product particles contained in the by-product gas while a lower end of the filtering member is blocked but the flow of the by-product gas is allowed through a side surface of the filtering member; an upper deposition panel and a lower deposition panel installed across the inside of the first casing at positions vertically spaced apart from each other and configured to deposit the by-product while coming into contact with the by-product gas introduced through the filtering member; and an upper cooling pipe and a lower cooling pipe installed inside the upper deposition panel and the lower deposition panel and allowing the cooling water supplied from the cooling water supply module to pass therethrough.

Through-pass holes may be formed at both end portions of the lower deposition panel so that even in a state in which the by-product is deposited on the entire lower deposition panel and thus the flow of the by-product gas is not smooth, the by-product gas passes directly through the through-pass holes to reach the outlet pipe.

The upper deposition panel and the lower deposition panel are each made of a metal lath that is a plate having a mesh shape so that a reaction by-product gas is in surface contact with the upper deposition panel and the lower deposition panel while passing therethrough.

A by-product collection apparatus according to the present invention includes a cooling water circulation system therein and thus can effectively collect various by-products generated during a manufacturing process at a low-temperature atmosphere using cooling water and be installed freely without restrictions even in a place where an infrastructure for supplying the cooling water is not established.

Even when the by-product collection apparatus according to the present invention has the cooling water circulation system therein, space-intensive installation can be achieved through a compact configuration.

DETAILED DESCRIPTION

A by-product collection apparatus according to embodiments of the present invention will be described in detail with reference to the accompanying drawings. Since the present invention may apply various changes and have various forms, specific embodiments will be illustrated in the drawings and described in detail in the text. However, it should be understood that the present invention is not limited to the specific embodiments and includes all changes, equivalents, and substitutes included in the spirit and scope of the present invention. In description of each drawing, similar reference numerals are used for similar components. In the accompanying drawings, the dimensions of structures are illustrated to be larger than the actual sizes for clarity of the present invention or to be smaller than the actual sizes to understand a schematic configuration.

Further, terms such as first and second may be used to describe various components, but the components should not be limited to the terms. The terms are used only for the purpose of distinguishing one component from another component. For example, without departing from the scope of the present invention, a first component may be referred to as a second component, and similarly, the second component may be referred to as the first component. Meanwhile, unless otherwise defined, all terms used herein including technical or scientific terms have the same meanings as those commonly understood by those skilled in the art to which the present invention belongs. Terms defined in commonly used dictionaries should be interpreted as having the same meanings in the context of the related art and may not be interpreted with ideal or excessively formal meanings, unless explicitly defined in the present application.

Embodiment

Figure 2:
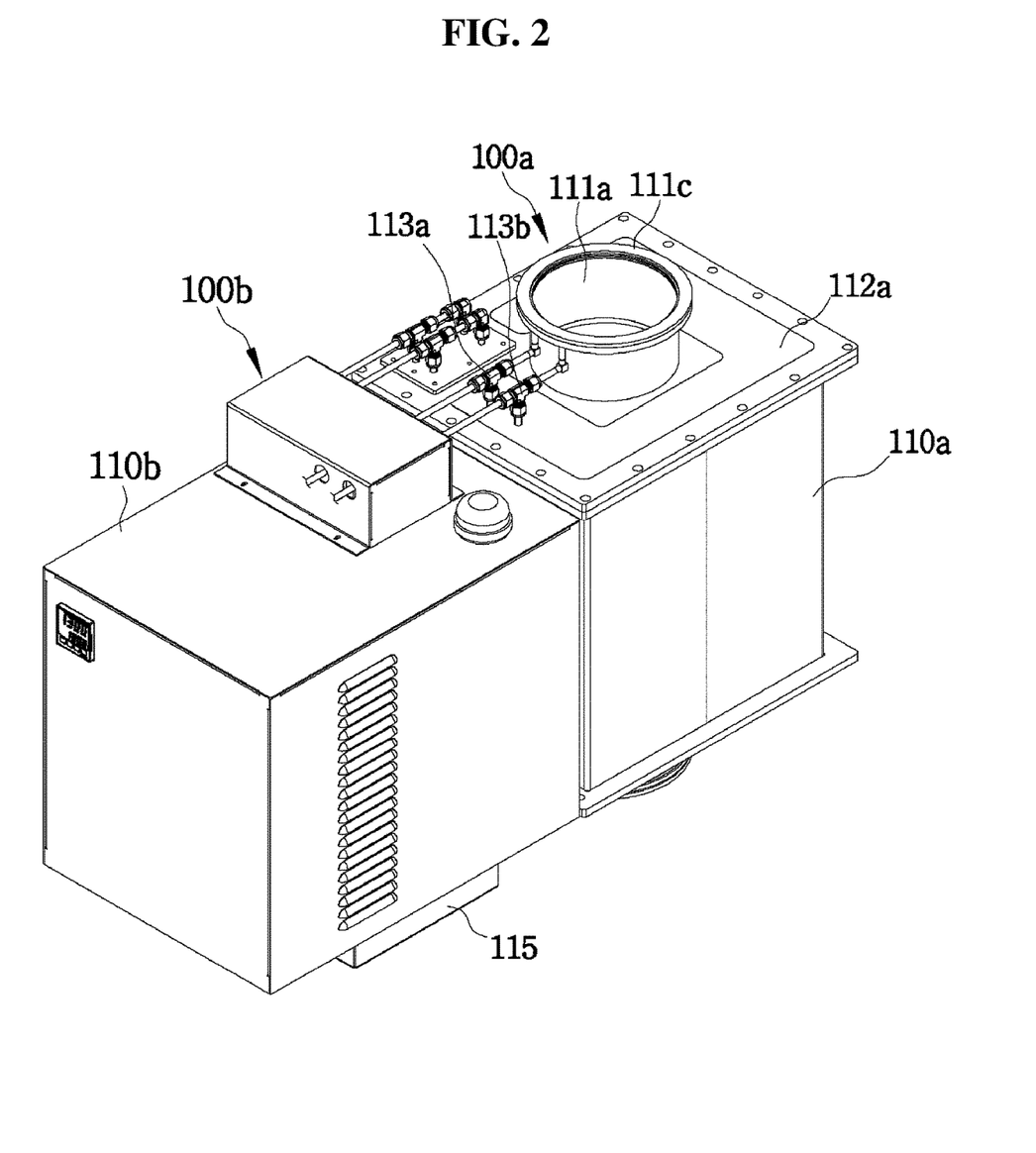
FIG. 2 is a perspective view of a by-product collection apparatus according to an embodiment of the present invention.
Figure 3:
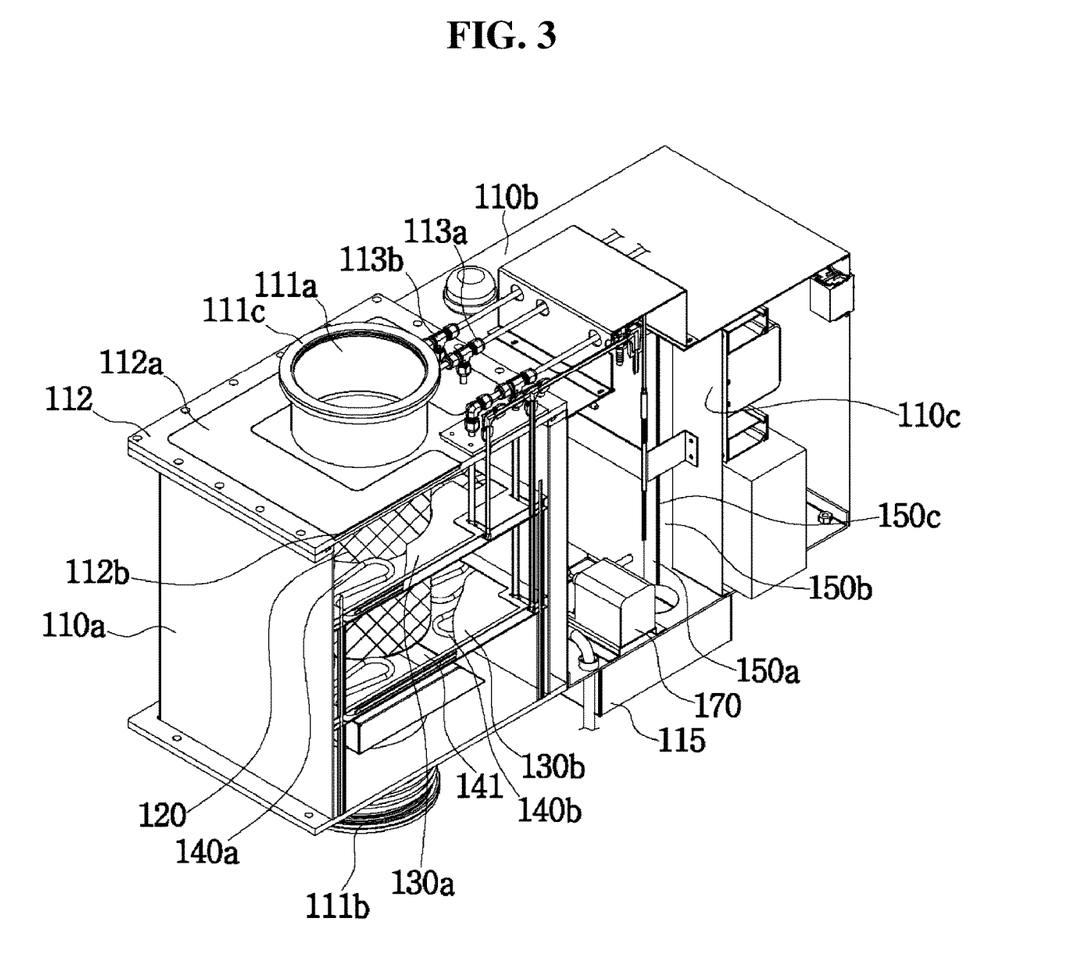
FIG. 3 is a partial cut-away view for describing a configuration of the by-product collection apparatus according to the embodiment of the present invention.
Figure 4:
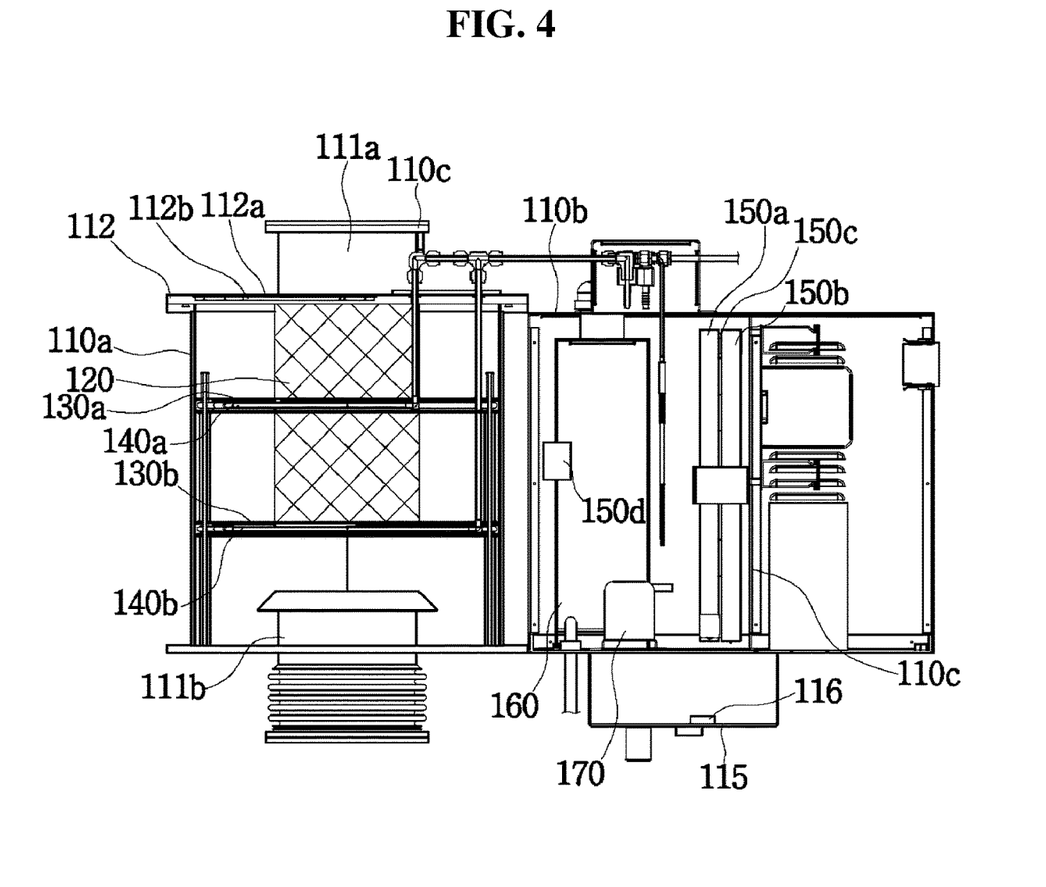
FIG. 4 is a front view of FIG. 3.
Figure 5:
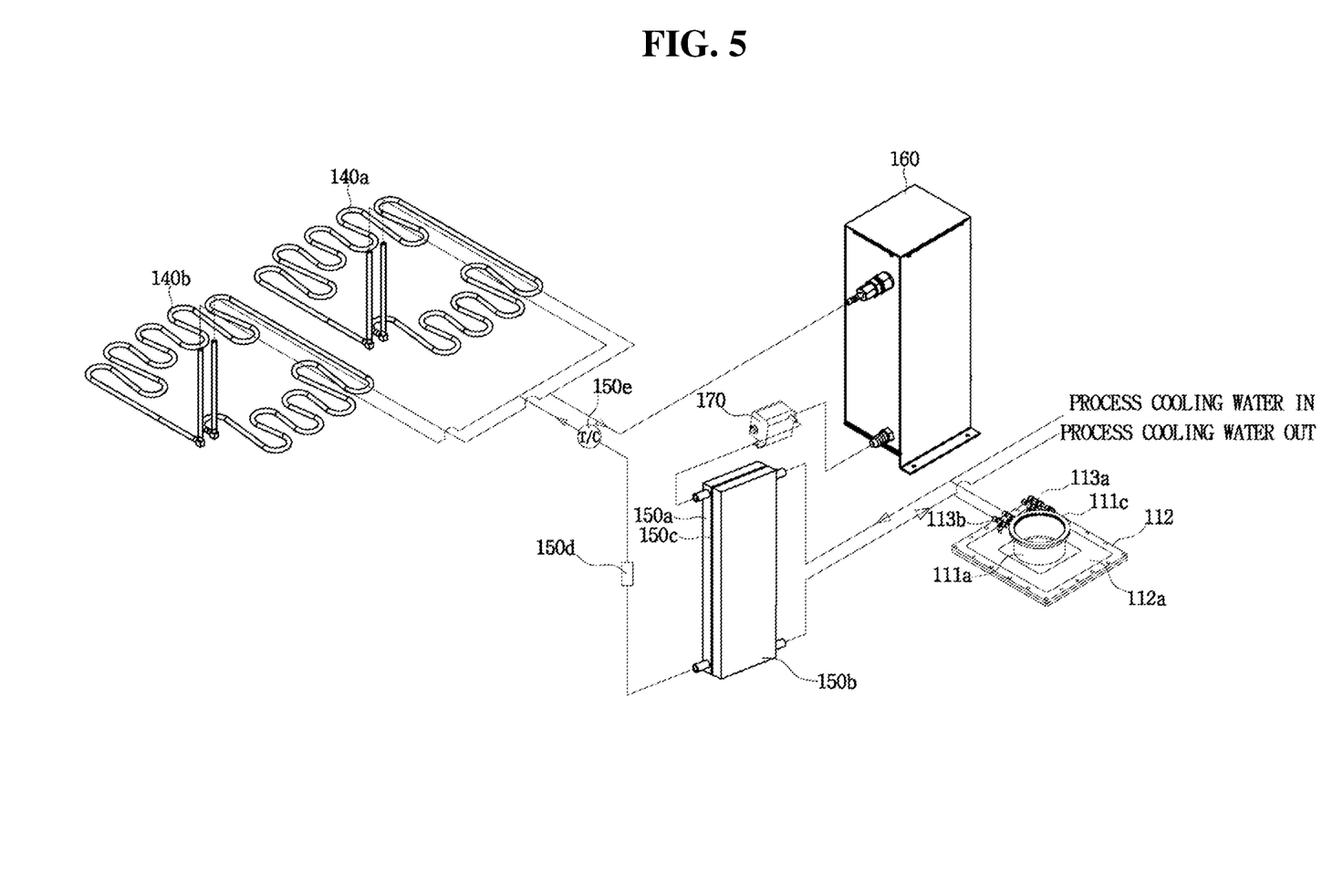
FIG. 5 is a view for describing a cooling water circulation system in the by-product collection apparatus according to the embodiment of the present invention.

FIG. 2 is a perspective view of a by-product collection apparatus according to an embodiment of the present invention, FIG. 3 is a partial cut-away view for describing a configuration of the by-product collection apparatus according to the embodiment of the present invention, FIG. 4 is a front view of FIG. 3, and FIG. 5 is a view for describing a cooling water circulation system in the by-product collection apparatus according to the embodiment of the present invention.

As illustrated in the drawings, the by-product collection apparatus according to the embodiment of the present invention is formed by integrating a by-product collection module 100a, which may effectively collect by-products using cooling water, with a cooling water supply module 100b for supplying the cooling water to the by-product collection module 100a. As illustrated in FIG. 5, the by-product collection apparatus according to the embodiment of the present invention may effectively collect by-products contained in a by-product gas through a configuration in which a cooling water circulation system configured to circulate the cooling water and a process cooling water half circulation system that effectively uses process cooling water supplied from the outside are provided together and may be installed freely without restrictions even in a place where an infrastructure for supplying the cooling water is not established.

Hereinafter, the by-product collection apparatus according to the embodiment of the present invention will be described in detail with reference to the respective components.

First, the by-product collection module 100a includes a first casing 110a, a filtering member 120, an upper deposition panel 130a, a lower deposition panel 130b, an upper cooling pipe 140a, and a lower cooling pipe 140b.

The first casing 110a includes an inlet pipe 111a and an outlet pipe 111b connected to a pipeline, through which the by-product gas flows, in upper and lower portions thereof, and is integrally coupled to a second casing 110b of the cooling water supply module 100b. The inlet pipe 111a is installed to pass through the upper surface of the first casing 110a and communicates with an upper end of the filtering member 120. The outlet pipe 111b is installed to pass through the lower surface of the first casing 110a, and an upper end thereof protrudes upward from the lower surface inside the first casing 110a. In this way, when the outlet pipe 111b is formed to protrude from the lower surface of the first casing 110a to form a step, even when a large amount of by-products are accumulated on the lower surface of the first casing 110a, the by-products may be prevented from easily leaking to the outside through the outlet pipe 111b.

The upper surface of the first casing 110a is formed as an upper cover 112 to be openable or closable. As illustrated in FIG. 3, a circulation hole 112b is formed inside the upper cover 112, wherein a portion of the process cooling water supplied to an inlet pipe flange 111c, which is branched off by a first branching pipe and is introduced into the inlet pipe flange 111c to be circulated and discharged through the circulation hole 112b. The circulation hole 112b is covered by a corresponding covering plate 112a. The circulation hole 112b is formed in a wide width from a center of the inlet pipe 111a of the upper cover 112 to the circumference of the upper cover 112 so that a sufficient amount of the process cooling water flows into the circulation hole 112b. In this way, when the circulation hole 112b for retaining the process cooling water in the upper cover 112 of the first casing 110a is provided widely, a low-temperature atmosphere is advantageously formed in an inner space of the first casing 110a, and deposition of the by-product gas coming into contact with the lower surface of the upper cover 112 may be induced.

The filtering member 120 is installed inside the first casing 110a in a state in which an upper end of the filtering member 120 communicates with a lower end of the inlet pipe 111a. A lower end of the filtering member 120 is blocked, but a flow of the by-product gas is allowed through the side surface. To this end, the filtering member 120 may have a plurality of perforations in the side surface thereof, may be a pipe-shaped hollow member made of a mesh-shaped metal lath or demister, or may be a cylindrical solid member. Here, the filtering member 120 is a substantially circular pipe or a cylinder for communication with the inlet pipe 111a, but is not limited in shape, and may be provided as a member having one of more various shapes as needed.

In this way, when the lower end of the filtering member 120 is blocked but the flow of the by-product gas is allowed through the side surface, immediately after the by-product gas is introduced through the inlet pipe 111a, the by-product gas passes through the filtering member 120, and thus relatively thick by-product particles are first filtered. In this case, as the by-product gas is widely spread and dispersed through the side surface while passing through the filtering member 120 and the flow rate is also slowed, a larger amount of the by-products are induced to be deposited on the upper deposition panel 130a and the lower deposition panel 130b. Such deposition of the by-products is mainly performed on the upper deposition panel 130a and the lower deposition panel 130b but is also performed on the side surface of the filtering member 120.

The upper deposition panel 130a and the lower deposition panel 130b are installed across the inside of the first casing 110a at positions vertically spaced from each other. It is preferable that the upper deposition panel 130a and the lower deposition panel 130b are each made of a perforated perforation plate or a metal lath that is a plate having a mesh shape such that even while the flow of the by-product gas is allowed, the by-products contained in the by-product gas may be effectively deposited.

The upper cooling pipe 140a and the lower cooling pipe 140b are installed in a zigzag shape inside the upper deposition panel 130a and the lower deposition panel 130b and allow the cooling water supplied from the cooling water supply module 100b to pass through the upper deposition panel 130a and the lower deposition panel 130b. When the upper cooling pipe 140a and the lower cooling pipe 140b are installed, the upper deposition panel 130a and the lower deposition panel 130b in contact with the by-product gas are cooled to a lower temperature, and thus the by-product gas may be rapidly solidified and deposited. Here, as illustrated in FIG. 3, through-pass holes 141 are formed at both side ends of the lower deposition panel 130b. Accordingly, even when the by-product is thickly deposited on the entire lower deposition panel 130b and thus the flow of the by-product gas is not smooth, the by-product gas may pass through the through-pass holes 141 to reach the outlet pipe 111b.

Meanwhile, the cooling water supply module 100b serves to supply the cooling water to the upper cooling pipe 140a and the lower cooling pipe 140b of the by-product collection module 100a and includes the second casing 110b, a heat exchange member, a cooling water tank 160, and a cooling water pump 170. Hereinafter, these components will be described in more detail.

It is preferable that the second casing 110b is integrally coupled to the first casing 110a of the by-product collection module 100a, and an inner space is divided into a first chamber and a second chamber by an inner wall 110c installed therebetween. The heat exchange member including a cooling tank 150a, a heat exchange tank 150b, and a thermoelectric plate 150c, the cooling water tank 160, and the cooling water pump 170 are installed in the first chamber located on the left side of the drawing, and a controller and electrical components for controlling and monitoring various operating components as well as the cooling water pump 170 are installed in the second chamber located in the right side of the drawing.

A water tank 115 that is a place in which the cooling water leaking from the inside of the second casing 110b is collected and a leak detection sensor 116 that is installed on the bottom surface of the water tank 115 and detects leaked cooling water are further provided below the second casing 110b. Accordingly, even a small amount of the cooling water leaking from a connection part with the cooling water tank 160, the cooling water pump 170, and the heat exchange member inside the second casing 110b may be easily detected. Accordingly, when the cooling water leaks, an action may be quickly performed.

The heat exchange member is installed on a cooling water supply side of the by-product collection module 100a and serves to cool the cooling water. To this end, the heat exchange member includes the thermoelectric plate 150c in which a plurality of thermoelectric elements are arranged such that a heat absorption surface and a heat emission surface face one side and the other side in a plan view, respectively, and the cooling tank 150a attached to face the heat absorption surface of the thermoelectric plate 150c. Further, it is preferable that the heat exchange member further includes a heat exchange tank 150b attached to face the heat emission surface of the thermoelectric plate 150c.

According to this configuration, the cooling water is cooled to a temperature close to 0° C. while passing through the cooling tank 150a located at the heat absorption surface of the thermoelectric plate 15c, and then cools the by-product gas while flowing through the upper cooling pipe 140a and the lower cooling pipe 140b of the by-product collection module 100a through the upper deposition panel 130a and the lower deposition panel 130b. The used cooling water undergoes circulation in which the cooling water is recovered to the cooling water tank 160, is cooled again through the cooling tank 150a, and is then supplied to the by-product collection module 100a. In this case, the heat exchange tank 150b receives the process cooling water supplied from the outside, allows the process cooling water to pass therethrough, and thus helps to smoothly discharge heat from the thermoelectric elements.

Both the cooling tank 150a and the heat exchange tank 150b installed facing the heat absorption surface and the heat emission surface of the thermoelectric plate 150c are formed in a flat rectangular parallelepiped shape, and thus the entire heat exchange member is formed in a flat shape. Accordingly, the heat exchange member is installed in a vertically erect shape near the inner wall of the second casing 110b of the cooling water supply module 100b, and thus an installation space may be easier to secure. In a layout of respective components located in a left first chamber inside the second casing 110b, the heat exchange member is vertically stood up in close contact with the inner wall, and the cooling water tank 160 is formed in a vertically elongated rectangular parallelepiped shape and is stood up near one corner of the remaining space of the first chamber to avoid the heat exchange member. Further, the cooling water pump 170 is installed in a front space remaining after the cooling water tank 160 is installed in the first chamber, and thus the use of the space is maximized.

Here, a portion of the process cooling water supplied to the heat exchange tank 150b is branched off to pass through an internal flow path formed in the inlet pipe flange 111c of the collection module 100a. To this end, the inlet pipe flange 111c of the by-product collection module 100a has an internal flow path formed in the circumferential direction thereof. In this way, when the portion of the process cooling water flows to pass through the internal flow path provided in the inlet pipe flange 111c, an O-ring sandwiched between the inlet pipe flange 111c and a flange of a pipe through which the by-product gas is transported may be effectively prevented from being deformed and damaged due to the by-product gas having a high temperature of 400° C. to 500° C.

Further, as described above, the portion of the process cooling water supplied to the inlet pipe flange 111c is branched off by a first branch pipe 113a and is introduced into the circulation hole 112b of the upper cover 112 of the first casing 110a. Accordingly, while a low-temperature atmosphere is induced inside the first casing 110a, the deposition of the by-product gas coming into contact with the lower surface of the upper cover 112 may be induced. The process cooling water passing through the internal flow path of the inlet pipe flange 111c and the process cooling water passing through the circulation hole 112c of the upper cover 112 are joined through a second branched pipe 113b and then discharged to the outside.

In this way, the by-product collection apparatus according to the embodiment of the present invention is provided with both the cooling water circulation system configured to circulate the cooling water therein and the process cooling water half circulation system that effectively uses the process cooling water, and such a circulation system may be identified at a glance through FIG. 5.

That is, in the case of the cooling water circulation system, a process is repeatedly performed in which the cooling water pumped from the cooling water tank 160 by the cooling water pump 170 is cooled while passing through the cooling tank 150a of the heat exchange member, cools the high-temperature by-product gas while passing through the upper cooling pipe 140a and the lower cooling pipe 140b of the by-product collection module 100a, induces the by-product gas to be rapidly solidified, and is then collected in the cooling water tank 160. Here, it is preferable that a flow control valve 150d and a temperature sensor 150e are further installed on a cooling water supply side of the by-product collection module 100a to adjust the supply amount of the cooling water and measure a supply temperature of the cooling water.

In the case of the process cooling water half-circulation system, the process cooling water supplied from the outside first absorbs heat emitted from the thermoelectric plate 150c while passing through the heat exchange tank 150b of the heat exchange member, and thus helps the cooling water to be cooled smoothly at the heat absorption surface of the thermoelectric plate 150c. Secondly, the portion of the process cooling water is branched off to pass through the internal flow path of the inlet pipe flange 111c of the first casing 110a and the circulation hole 112b of the upper cover 112, and thus prevents the O-ring from being deformed and damaged and helps to collect the by-product. In this way, the process cooling water is branched off and passes through the heat exchange tank 150b of the heat exchange member, the inlet pipe flange 111c, and the upper cover 112, and is collected and discharged to the outside again.

Although the exemplary embodiments of the present invention have been described above, the present invention may use various changes, modifications, and equivalents. It is apparent that the present invention can be equally applied by appropriately modifying the above embodiments. Therefore, the above description does not limit the scope of the present invention determined by the limit of the appended claims.

The invention claimed is:

1. A by-product collection apparatus which collects a by-product generated during a manufacturing process of manufacturing a semiconductor, the apparatus comprising:
a by-product collection module connected to a pipeline in series and configured to collect a by-product from a by-product gas, wherein the by-product gas flows in the pipeline having an inlet pipe and an outlet pipe provided at upper and lower portions of a first casing; and
a cooling water supply module including a cooling water tank and a cooling water pump in a second casing and configured to supply and recover cooling water to and from the by-product collection module through a cooling pipe,
wherein the cooling water supply module further includes a heat exchange member installed on a cooling water supply side of the by-product collection module, and
wherein the heat exchange member includes a thermoelectric plate in which a plurality of thermoelectric elements are arranged in a state in which a heat absorption surface and a heat emission surface face one side and the other side in a plan view, respectively, and a cooling tank attached to face the heat absorption surface of the thermoelectric plate so that the cooling water passes through the cooling tank before being supplied to the by-product collection module.

2. The by-product collection apparatus of claim 1, wherein the first casing of the by-product collection module and the second casing of the cooling water supply module are integrally coupled to each other.

3. The by-product collection apparatus of claim 1, wherein, in the heat exchange member, the thermoelectric plate is formed in a quadrangular shape, and the cooling tank is formed in a flat rectangular parallelepiped shape to correspond to and face the thermoelectric plate and is vertically stood up.

4. The by-product collection apparatus of claim 1, wherein the heat exchange member further includes a heat exchange tank attached to face the heat emission surface of the thermoelectric plate so that heat dissipation of the thermoelectric element is smoothly performed while process cooling water supplied from the outside passes through the heat exchange tank.

5. The by-product collection apparatus of claim 4, wherein, in the heat exchange member, the thermoelectric plate is formed in a quadrangular shape, and the heat exchange tank is formed in a flat rectangular parallelepiped shape to correspond to and face the thermoelectric plate and is vertically stood up.

6. The by-product collection apparatus of claim 4, wherein an inlet pipe flange of the by-product collection module has an internal flow path formed in a circumferential direction thereof, and a portion of the process cooling water supplied to the heat exchange tank is branched off and passes through the internal flow path formed in the inlet pipe flange of the collection module.

7. The by-product collection apparatus of claim 6, wherein:
an upper surface of the first casing of the by-product collection module is formed as an upper cover to be openable or closable;
a circulation hole is formed inside the upper cover; and
a portion of the process cooling water supplied to the inlet pipe flange is branched off and introduced into the inlet pipe flange to be circulated and discharged through the circulation hole to induce deposition of the by-product gas coming into contact with a lower surface of the upper cover.

8. The by-product collection apparatus of claim 7, wherein the circulation hole is formed with a wide width from a center of the inlet pipe of the upper cover to a circumference of the upper cover.

9. A by-product collection apparatus which collects a by-product generated during a manufacturing process of manufacturing a semiconductor, the apparatus comprising:
a by-product collection module connected to a pipeline in series and configured to collect a by-product from a by-product gas, wherein the by-product gas flows in the pipeline having an inlet pipe and an outlet pipe provided at upper and lower portions of a first casing;
a cooling water supply module including a cooling water tank and a cooling water pump in a second casing and configured to supply and recover cooling water to and from the by-product collection module through a cooling pipe;
a water tank which is installed below the second casing of the cooling water supply module and is a place in which the cooling water leaking from an inside of the second casing is collected; and
a leak detection sensor installed on a bottom surface of the water tank and configured to detect the leaked cooling water,
wherein leakage of the cooling water is detected with only a small amount of water leakage.

10. A by-product collection apparatus which collects a by-product generated during a manufacturing process of manufacturing a semiconductor, the apparatus comprising:
a by-product collection module connected to a pipeline in series and configured to collect a by-product from a by-product gas, wherein the by-product gas flows in the pipeline having an inlet pipe and an outlet pipe provided at upper and lower portions of a first casing; and
a cooling water supply module including a cooling water tank and a cooling water pump in a second casing and configured to supply and recover cooling water to and from the by-product collection module through a cooling pipe,
wherein the by-product collection module includes:
a first casing including an inlet pipe and an outlet pipe connected to a pipeline, through which the by-product gas flows, in upper and lower portions of the first casing;
a filtering member installed inside the first casing in a state in which an upper end of the filtering member communicates with a lower end of the inlet pipe, and configured to filter some by-product particles contained in the by-product gas while a lower end of the filtering member is blocked but the flow of the by-product gas is allowed through a side surface of the filtering member;
an upper deposition panel and a lower deposition panel installed across an inside of the first casing at positions vertically spaced apart from each other and configured to deposit the by-product while coming into contact with the by-product gas introduced through the filtering member; and an upper cooling pipe and a lower cooling pipe installed inside the upper deposition panel and the lower deposition panel and allowing the cooling water supplied from the cooling water supply module to pass therethrough.

11. The by-product collection apparatus of claim 10, wherein through-pass holes are formed at both end portions of the lower deposition panel so that even in a state in which the by-product is deposited on the entire lower deposition panel and thus the flow of the by-product gas is not smooth, the by-product gas passes directly through the through-pass holes to reach the outlet pipe.

12. The by-product collection apparatus of claim 10, wherein the upper deposition panel and the lower deposition panel are each made of a metal lath that is a plate having a mesh shape so that a reaction by-product gas is in surface contact with the upper deposition panel and the lower deposition panel while passing therethrough.

\* \* \* \* \*